US005631511A

United States Patent [19]
Schulmann et al.

[11] Patent Number: 5,631,511
[45] Date of Patent: May 20, 1997

[54] GEAR MOTOR WITH AN ELECTRIC MOTOR HAVING A HOLLOW SHAFT

[75] Inventors: Winfried Schulmann, Kleinosteim; Franz Thimm, Alzenau; Helmut Kaiser, Bruchköbel, all of Germany

[73] Assignee: Leybold Aktiengesellschaft, Hanau am Main, Germany

[21] Appl. No.: 311,355

[22] Filed: Sep. 23, 1994

[30] Foreign Application Priority Data

Sep. 23, 1993 [DE] Germany ............. 43 32 323.5

[51] Int. Cl.⁶ ............. H02K 7/10; H02K 7/116; F16D 27/12
[52] U.S. Cl. ............. 310/83; 310/78; 310/92; 310/99; 254/316; 117/13
[58] Field of Search ............. 310/83, 112, 78, 310/92, 101, 103, 108; 192/18 B, 100, 110 R; 117/202; 254/316, 317, 292, 299, 348, 365

[56] References Cited

U.S. PATENT DOCUMENTS

| 1,870,076 | 8/1932 | Thomson | 310/112 |
|---|---|---|---|
| 2,180,412 | 11/1939 | Hart | 192/84 |
| 2,600,762 | 6/1952 | Hartz | 74/6 |
| 3,921,770 | 11/1975 | Daab et al. | 192/18 |
| 3,974,719 | 8/1976 | Tiliander | 74/6 |
| 4,185,520 | 1/1980 | Henneman et al. | 74/750 R |
| 4,298,110 | 11/1981 | Toma | 192/48.4 |
| 4,367,199 | 1/1983 | Jericho | 117/202 |
| 4,825,988 | 5/1989 | Nishimura | 192/12 BA |
| 5,194,057 | 3/1993 | Sommer | 192/18 |
| 5,269,202 | 12/1993 | Kiyosawa et al. | 74/640 |

FOREIGN PATENT DOCUMENTS

| 55080 | 4/1967 | German Dem. Rep. | 310/101 |
|---|---|---|---|
| 815064 | 9/1951 | Germany | 310/83 |

Primary Examiner—Thomas M. Dougherty
Assistant Examiner—Burton S. Mullins
Attorney, Agent, or Firm—Felfe & Lynch

[57] ABSTRACT

A gear motor (1), with an electric motor (4) whose rotor (7) has a hollow shaft (8), drives, through at least one gear box (26) with at least one drive step, at least one load. For the purpose of compact configuration combined with low vibration, there is coaxially disposed in the hollow shaft (8) an output shaft (19) which can be shifted selectively by means of a first clutch (24) to the hollow shaft (8), and by means of a second clutch (16) via the gear box (26) to the hollow shaft (8). Preferably the clutches are configured as magnetic clutches, and again preferably the first clutch (24) is disposed for the direct shifting of the hollow shaft (8) to the output shaft (19) at the one end of the hollow shaft (8), and the second clutch (16) at the other end of the hollow shaft (8). The gear motor (1) is used preferentially for driving rotary parts in crystal pulling apparatus.

20 Claims, 3 Drawing Sheets

GEAR MOTOR WITH AN ELECTRIC MOTOR HAVING A HOLLOW SHAFT

BACKGROUND OF THE INVENTION

The invention relates to a gear motor with an electric motor whose rotor has a hollow shaft which is disposed on an output shaft, and whose torque can be transferred to the output shaft through a gearing with at least one drive shaft and a clutch.

Gear motors in which the hollow shaft is permanently connected to the gearing or directly to the load are known. It is also known to configure the gearing as a shift gearing in order to be able to drive the load at different rotatory speeds. Such gear motors are often used when the load has to be driven at different speeds, as for example in a so-called "fast forward" mode or with a considerable reduction to enable the performance of slow operations. One especially interesting application is, for example, so-called crystal pulling apparatus in which crystals of semiconductor material are drawn by the Czochralski method from the molten material. For the slow-running pulling process a very low rotatory speed is required at the output end. To raise the finished crystal or lower a seed crystal holder to start another drawing process, however, a fast speed is needed as a rule so as to reduce the idle time of the pulling apparatus. For this purpose special shifting gear motors have been used in the past, which did not form a single unit with the electric motor. Also, the known gear transmissions lacked the great smoothness of operation required for a crystal pulling process, and lastly the known drives had an unfavorable ratio of torque to the size of their structure.

U.S. Pat. No. 4,660,669 discloses a drive of the class described above, which is called an electrical servo unit. In this case, however, the electric motor is provided only as an auxiliary drive, and the actual torque is applied to a drive shaft by an external drive unit. The auxiliary motor with its hollow shaft can be applied when needed, through gears and a magnetic clutch, to an output shaft. The drive shaft and output shaft are connected to one another resiliently through a torsion bar and leaf spring, but with the same speed, the torque angle being used to actuate a switch by which the auxiliary motor can be turned on and off. The gear transmission and clutch, therefore, do not serve to vary the rotatory speed ratio between the drive shaft and driven shaft, both of which are configured as solid shafts.

French Patent 1 437 856 discloses a gear motor in which the solid shaft of an electric motor can be applied to the output shaft through a single double-action clutch with two friction pairs either directly or via a planetary gear drive. Only the housing of the planetary gear drive has a hollow shaft. To avoid having to shift the motor shaft to operate the clutch, one of the two parts of the clutch is mounted for axial displacement. Because of the double-action clutch, this shifting takes place against the action of strong compression springs, so that a very strong pot magnet is provided to actuate the clutch. On account of the series arrangement of motor shaft, clutch, planetary drive and output shaft, this known system has a very great structural length and, due to the masses that have to be moved, the engagement of the clutch causes severe vibration of the unit.

SUMMARY OF THE INVENTION

The invention is therefore addressed to a gear motor of the class described above, which can be made at reasonable cost, will have a favorable ratio of torque to structural bulk, permit changing the output speed, operate with very little vibration especially at low speeds, and qualify for use in a clean-room environment.

In the gear motor according to the invention, the hollow shaft can be applied to the output shaft as desired, so as to produce various speeds of the output shaft, while circumventing the gearing when desired by means of an additional clutch which can be operated independently of the clutch associated with the gear drive.

Such a gear motor can be manufactured at reasonable cost, using a large number of commercially available components, has a favorable ratio of speed to the size of its structure, is qualified for use in a clean-room environment, and runs very smoothly, especially at low speeds, but at the same time permits high speeds for the so-called "fast forward." Particularly necessary in this case is the use of only one electric motor, so that a gear motor of this kind is suitable to special advantage for use in crystal pulling apparatus. Its application is not limited to this, but other possibilities for the use of such a gear motor are conceivable.

The described additional clutch does not have to engage the output shaft directly to the hollow shaft. Instead, additional gearing can be provided between the hollow shaft and the output shaft, especially a gearing with a different stepdown ratio than the other gearing. The entire system is made substantially coaxial; it can be housed, fully enclosed, in a compact cylindrical case.

Different kinds of loads can be driven with the known gear motor; they can be connected, for example, to both ends of the output shaft. Consequently, the invention admits of many possible combinations. For example, spindle drives, handling systems, machine tool feeds and similar units can be driven by the gear motor of the invention.

As a further development of the invention it is especially advantageous if the additional clutch is disposed on the one end of the hollow shaft to connect the hollow shaft directly to the output shaft, and the second clutch on the other end of the hollow shaft for the engagement of the gears.

It is then also advantageous if at least one of the clutches is a magnetic clutch. Such clutches can be engaged by remote control and consequently involve no intervention of mechanically movable parts into the motor and transmission case.

The use of two clutches which can be operated simultaneously by means of a switching system, creates an additional possibility, namely the complete self-locking of the system.

It is furthermore possible in that case to divide the output shaft into two halves and connect the hollow shaft directly to the one half with the first clutch, and to the other half with the second clutch, so that both halves of the shaft can be driven simultaneously but at different output speeds.

If in this case, in line with still another embodiment of the invention, a third clutch is disposed between the two shafts; then when this clutch is engaged both of the shafts will again have the same output speeds, and, by the simultaneous engagement of all the clutches the system can again be locked up.

It is furthermore especially advantageous to use as the transmission a step-down gearing in which a fixed internal gear engages a flexible spur gear with a number of teeth that is only slightly smaller than the number of teeth of the internal gear. Such transmissions are known as "harmonic drive transmissions" and are explained in detail in Technische Rundschsu, vol. 46, 1991, pages 56 to 64 under the title, "Präzionsgetriebetechnik - die Kleinen mit dem grossen Können."

DETAILED DESCRIPTION OF THE PREFERRED EMBODIMENT

Figure 1:
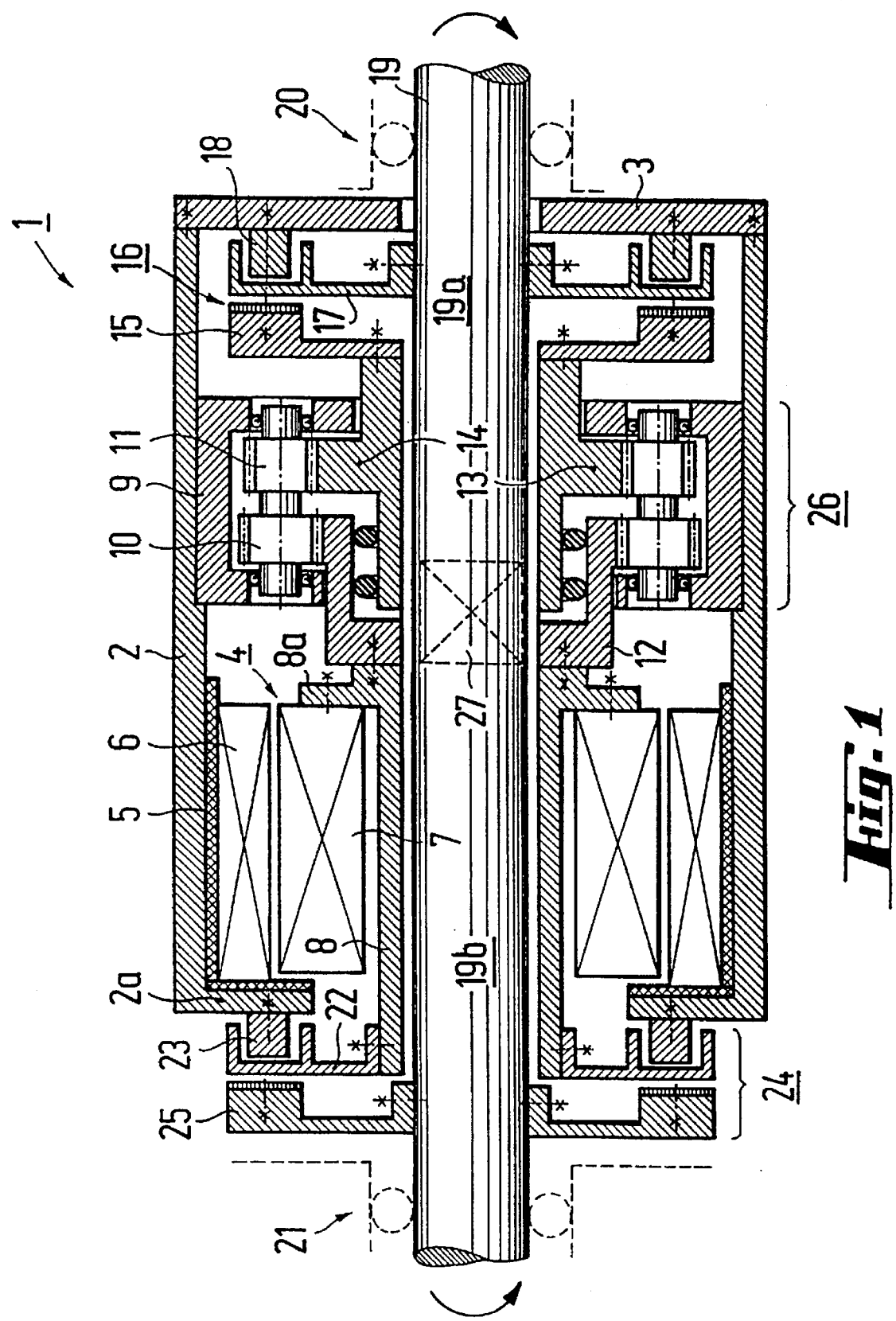
FIG. 1 shows an axial section through a gear motor according to the invention.

In FIG. 1 a gear motor 1 is shown, contained in a fixedly mounted cylindrical case 2 which is closed at one end by a cover 3. In the case 2 there is an electric motor 4 which is contained in a motor housing 5 and consists of a stator winding 6 and a rotor 7 which is fastened to a radial flange 8a of a hollow shaft 8.

Also disposed in the case 2 is a gear box S in which two sets of planetary gears 10 and 11 having different diameters are journaled. The planetary gears 10 are driven by a first sun gear 12 which is of a pot-like configuration and is joined to the hollow shaft 8 so as to rotate therewith. On account of the diameter difference of the planetary gears a second sun gear 13 is driven at a lower speed, the hub 14 of which is journaled coaxially in the first sun gear 12 on rollings bearings not further identified. The hub 14 of the second sun gear 13 rotates together with a driving part 15 of a first magnetic clutch 16 which has a driven part 17 and a stator part 18 which is affixed to the cease cover 3. In the stator part 18 is a magnet coil not further identified here, which when excited causes the driving part 15 to engage the driven part 17. The latter is corotational with an output shaft 19 which is coaxially disposed both in the hollow shaft 8 and in the hub 14. The output shaft 19 passes through the entire case 2 and is journaled at both ends on rolling bearings 20 and 21 indicated in broken lines.

At the opposite end of the output shaft 19 is another driving part 22 which rotates together with the hollow shaft 8. On the end flange 2a of the case 2 is another stationary stator part 23 which, like part 18, has a magnet coil. Thus a second magnetic clutch 24 is formed, which also includes a driven part 25 which is fastened for corotarion with the output shaft 19. When the magnet coil of the stator part 23 is excited, the driving part 22 and the driven part 25 are coupled together magnetically, so that the output shaft 19 rotates at the same speed as the hollow shaft 8.

The gear motor 1 in FIG. 1 operates as follows: When the second magnetic clutch 24 is energized the output shaft 19 is driven at the same speed as the rotor 7 and the hollow shaft 8. Since the speed of rotor 7 is high, the hollow shaft 19 can drive a load, here not shown, at a correspondingly high speed, i.e., in "fast forward." If the magnetic clutch 24 is shut off and instead the first magnetic clutch 16 turned on, the output shaft 19 is driven at the speed of the hub 14 on the output end of the planetary drive. The output shaft 19 can be driven at a speed reduced according to the step-down ratio of the gearing 26, for example at a so-called "crawl."

If both of the magnetic clutches 16 and 24 are energized simultaneously, the output shaft 19 is stopped with respect to the case 2 on account of the different speed of the sun gears 12 and, 13. Since the case 2 is fixedly mounted, the output shaft 19 can no longer be rotated.

Approximately in the center of the output shaft 19 an additional clutch 27 is indicated in broken lines, which divides the output shaft 19 into a first shaft portion 19a and a second shaft portion 19b. If the connection between these two shafts is interrupted, the two shafts 19a and 19b are driven independently of one another and at different speeds. If such a system must now be stopped, all of the clutches 16, 24 and 27 must be energized simultaneously.

Figure 1A:
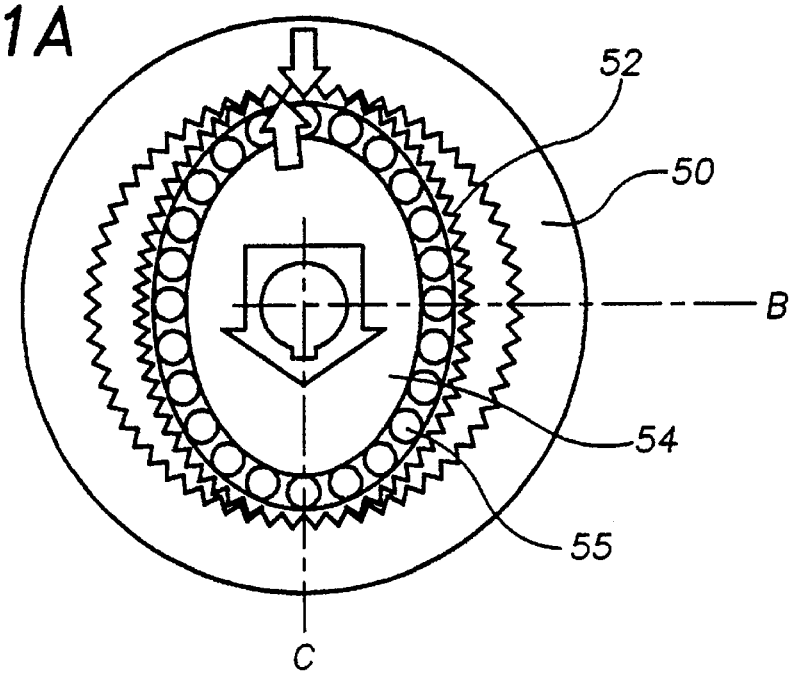
FIG. 1A is a schematic view of the gears in a harmonic drive transmission.

The transmission 26 can be replaced by a "harmonic drive transmission" in accordance with the article in "Technische Rundschau," 1991, vol. 46, pages 56 to 64, which will permit a much greater speed reduction, and likewise a much more greatly reduced vibration of the output shaft. The principle of such a transmission is illustrated schematically by FIGS. 1A, 1B and 1C. The flexible spur gear 52 is deformed by a circumferential elliptical control body 54 with the interposition of rolling bearings 55 such that the flexible spur gear 52 engages the internal gear 50 at two diametrically opposite points, while the points of engagement constantly migrate on the inner circumference of the internal gear 52. By a difference of only two teeth between the two gears it is thus brought about that one full rotation of the elliptical control body 54 moves the internal gear 52 only by the space between two teeth. In this manner a very great reduction ratio can be achieved, and the smoothness of the operation of such a transmission is, as its name implies, extremely great, so that such a transmission is especially advantageous for crystal pulling processes. Such a transmission is not, of course, suitable for any so-called "fast forward," so that in this case the solution according to the invention fully applies for connecting the hollow shaft 8 of the electric motor directly to the output shaft 19 through the first clutch 16. In this manner a coaxial drive system can produce two output speeds which can be very far apart.

Figure 1B:
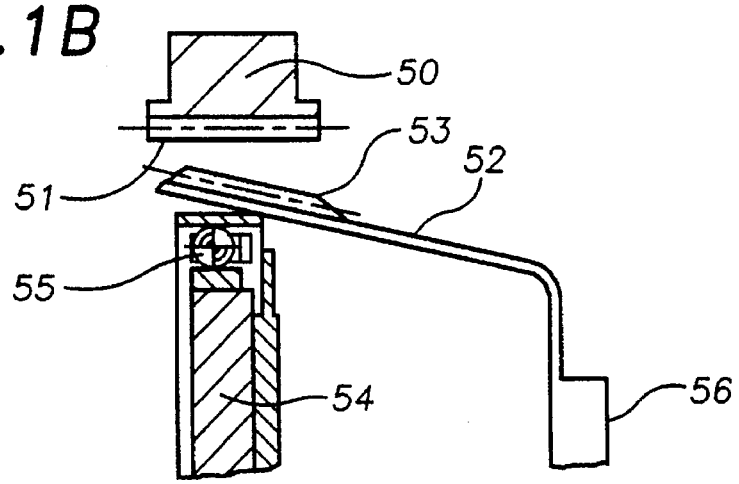
FIG. 1B is a section along line B—B of FIG. 1A.
Figure 1C:
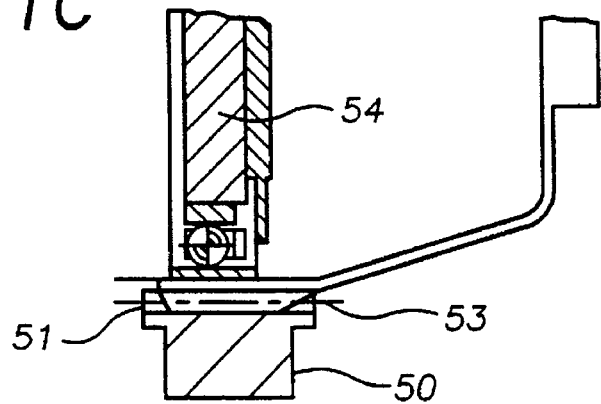
FIG. 1C is a section along line C—C of FIG. 1A.

Referring to FIG. 1B, the gear 50 having internal teeth 51 would be fixed to the case 2 of FIG. 1. The elliptical control body 54 would be fixed to the hollow shaft 8 on which the rotor is mounted, so that the body 8 must have a central hole to accommodate shaft 19. The flange 56 of the spur gear 52, on the other hand, would be fixed to the driving part 15. On engaging the clutch 26, then, the shaft 19 would be driven at the reducing ratio of the harmonic drive transmission. FIG. 1B simply shows a part of the gears where teeth 51, 53 are not engaged. The flexible cup of the gear 52 permits the sequential engagement of teeth illustrated in FIG. 1C.

If the electric motor 4 is speed-controlled, the various output speeds can be varied accordingly.

Figure 2:
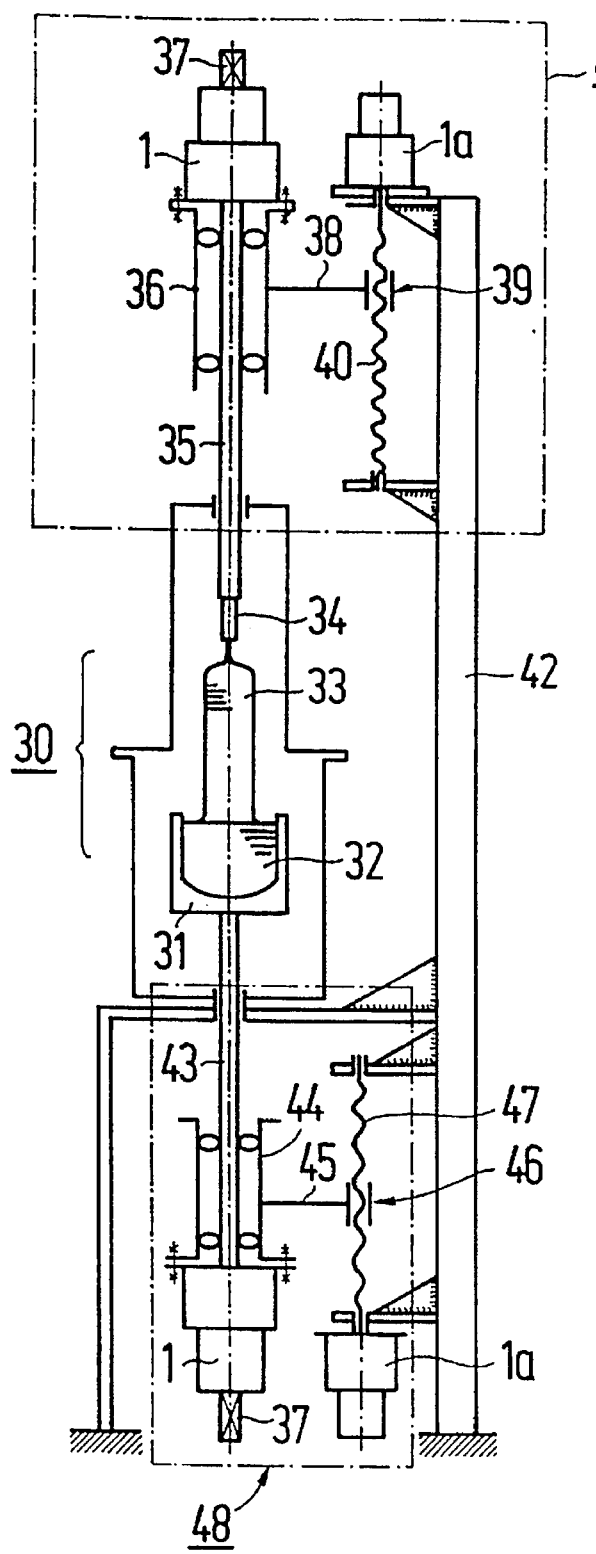
FIG. 2 a schematic diagram of a first embodiment of a crystal pulling apparatus for the Czochralski process, and FIG. 3 a schematic diagram of a second embodiment of a crystal pulling apparatus for the practice of the Czochralski process, also with several gear motors of the kind according to the invention.
Figure 3:
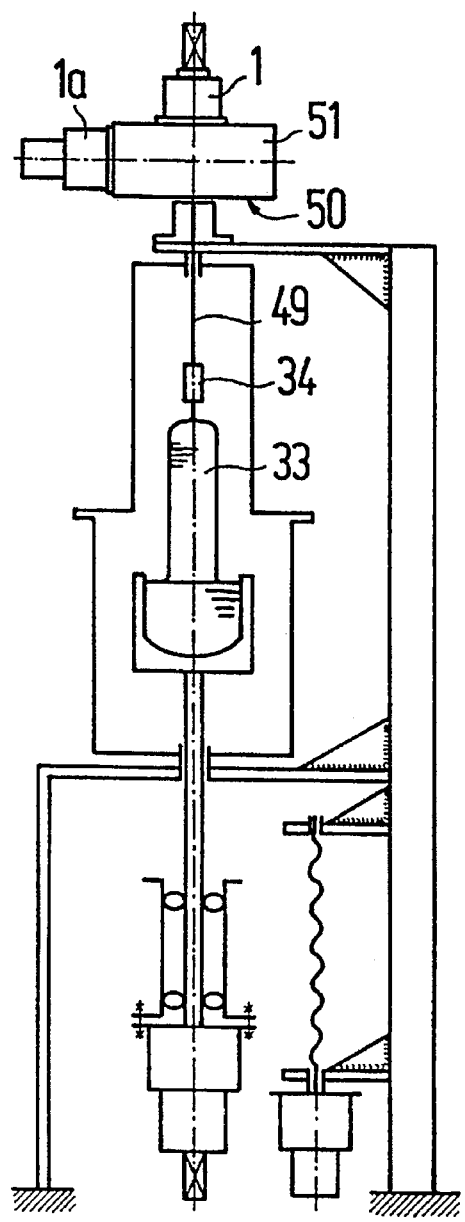

FIGS. 2 and 3 show the use of several gear motors according to FIG. 1 at different locations in two different crystal pulling apparatus for the practice of the Czochralski pulling method.

In FIG. 2 a hermetically sealed chamber 30 is shown, in which there is a heated melting crucible 31 containing a melt 32 of a doped semiconductor material. A crystal 33 is drawn up out of this melt, and can be, for example, an appropriately doped monocrystal. The crystal 33 depends from a seed crystal holder 34 situated at the bottom end of a pulling shaft 35. This pulling shaft is journaled in a bearing housing 36 bearing at its upper end a gear motor 1 according to FIG. 1, by which the pulling shaft 35 can be made to rotate at a low speed. At the upper end the pulling shaft 35 has a rotary connection 37 of a known type through which the coolants can be fed.

The bearing housing 36 is connected by a boom 38 and a nut 39 to a threaded spindle 40 by which the entire rotary drive described above, including the pull shaft 35, can be moved up and down. The threaded spindle 40 is journaled at both ends in bearings not further identified here and is made to rotate by a similar gear motor 1a. This gear motor 1a enables the spindle 40 to be driven at widely different speeds by the selective engagement of the magnetic clutch 16 or 24, so that the pull shaft 35 can be raised or lowered at the fast-forward or crawl rate of speed. The crawl speed serves, for example, for the actual pulling process, while the fast-forward speed serves to raise the finished crystal away from the rest of the melt 32 or else to lower a new seed crystal into the melt 32 (after replacing the amount consumed), and then the reduction of the rotary speed starts another pulling process. The components located in the upper, dash-dotted box 41 form the so-called "pull drive," which is borne by a vertical column 42.

The crucible 31 is disposed at the upper end of a raising shaft 43 which is journaled in an additional bearing housing 44 in a manner similar to the pull shaft 35. At the bottom end of the pull shaft 43 is an additional gear motor 1 in accord with FIG. 1, with a similar clutch 37. The bearing housing 44 is also connected by a boom 45 and a spindle nut 46 to a spindle 47 which is likewise mounted at both ends in bearings not further identified. The threaded spindle 47 is also driven by a gear motor 1a which is shiftable in speed in a manner similar to the gear motor 1a (in box 41) pertaining to the pulling feed. The components situated in the lower, dash-dotted box 48 form the so-called "crucible feed." Like the pulling feed (box 41), the crucible feed can also be shifted either to crawl speed or to fast forward.

Insofar as the components used in the second variant according to FIG. 3 are the same as those in the subject of FIG. 2, repetition of the reference numbers is omitted. Unlike FIG. 2, in the subject of FIG. 3 the crystal 33 is not, however, raised and rotated by a pull shaft 35 but by a so-called "pull rope" 49, at whose bottom end a seed crystal holder 34 is likewise located.

For the rotation of the pull rope 49, a gear motor 1 is provided similarly to FIG. 2, which in the present case rotates not only the pull rope 49 but also a reference platform 50 on which a housing 51 is disposed in which a winch for winding and unwinding the pull rope 49 is coaxial with the axis of rotation of the pull rope. This winch is powered by a gear motor 1a, which again corresponds to the embodiment in FIG. 1, and enables the changing of the speeds in the manner already described. Details of the lifting and turning drive for the pull rope 49 and thus for the crystal 33 are described in DE 43 29 283, which corresponds to U.S. application Ser. No. 302,194, filed Aug. 31, 1994. As it also appears from a comparison of FIGS. 2 and 3, the pull-rope drive according to FIG. 3 results in a decidedly lower structure of the apparatus.

All of the drives and transmission elements in FIGS. 2 and 3 are free in the rotary and longitudinal direction from vibration and play, and the spindle drives are in the form of circulating ball drives (in the spindle nuts). The advantageous action of these transmission elements is effectively enhanced by the principle of the "harmonic drive gear."

The "loads" mentioned above are the transmission elements and the machine and apparatus parts driven thereby, especially those of crystal pulling apparatus.

What is claimed is:

1. Gear motor (1, 1a) with an electric motor (4) whose rotor (7) has a hollow shaft (8) which is disposed on an output shaft (19, 19a, 19b) and whose torque can be transmitted to the output shaft (19, 19a, 19b) through a transmission (26) with at least one transmission speed and through a first clutch (16), characterized in that the hollow shaft (8) can be engaged with the output shaft (19, 19a, 19b) as desired, so as to produce various speeds of the output shaft (19, 19a, 19b), while circumventing said transmission (26) when desired, by means of a second clutch (24) which can be operated independently of the first clutch.

2. Gear motor according to claim 1, characterized in that the second clutch (24) is disposed at one end of the hollow shaft (8) for a direct connection of the hollow shaft (8) to the output shaft (19), and the first clutch (16) is disposed at the other end of the hollow shaft (8).

3. Gear motor according to claim 1, characterized in that at least one of the clutches (16, 24) is configured as a magnetic clutch.

4. Gear motor according to claim 1, characterized in that the first and second clutches (16, 24) can be engaged simultaneously.

5. Gear motor according to claim 1, characterized in that them output shaft (19) is divided into a first shaft portion (19a) and a second shaft portion (19b) and that the hollow shaft (8) can be connected by means of the second clutch (24) directly to the second shaft portion (19b), and by means of the first clutch (16) to the first shaft portion (19a).

6. Gear motor according to claim 5, characterized in that a third clutch (27) is disposed between the two shaft portions.

7. Gear motor according to claim 1, wherein the transmission is a step-down transmission of the "harmonic drive transmission" type, in which a rigid internal gear engages a flexible spur gear with a number of teeth that is only slightly smaller than the number of teeth in the internal gear.

8. Use of a gear motor (1, 1a) according to claim 1 for driving a rope drum in crystal pulling apparatus for the practice of the Czochralski process.

9. Use of a gear motor (1, 1a) according to claim 1 for driving pull shafts (35) and pull ropes (49) for pulled crystals (33) and/or of lift shafts (43) of melting crucibles (31) with a melt (32) for the formation of a crystal (33) by the Czochralski process.

10. Use of a gear motor (1, 1a) according to claim 1 for driving threaded spindles (40, 47) in crystal pulling apparatus.

11. Gear motor for driving an output shaft, said gear motor comprising an electric motor having a stator and a rotor for developing torque, a hollow shaft fixed to said rotor, said hollow shaft being concentric to said output shaft, a transmission connected to said hollow shaft, a first clutch which is engageable to transmit torque from said rotor to said output shaft via said transmission, a second clutch which is engageable independently of said first clutch to transmit torque from said rotor to said output shaft independently of said transmission.

12. Gear motor as in claim 1 wherein said second clutch is directly engageable to said output shaft to drive said output shaft at like speed as said rotor.

13. Gear motor as in claim 1 wherein said hollow shaft has axially opposed ends with said transmission and first clutch at one end and said second clutch at the other end.

14. Gear motor as in claim 11 wherein said clutches are engageable simultaneously to prevent rotation of said shaft.

15. Gear motor as in claim 11 wherein said output shaft comprises a first portion driven by said motor through said first clutch and a second portion driven by said motor through said second clutch.

16. Gear motor as in claim 15 further comprising a third clutch which is engageable to fix said first port, ion of said output shaft to said second portion of said output shaft.

17. Gear motor as in claim 11 wherein said transmission is a harmonic drive transmission comprising a stationary gear having a number of internal teeth in a continuous circular array which is concentric to said output shaft, an elliptical control body fixed to said hollow body concentric to said output shaft, and a flexible spur gear situated about said elliptical body and having a number of external teeth which engage said internal teeth of said stationary gear at two diametrically opposed points determined by the position of the said control body, the number of external teeth being less than the number of said internal teeth.

18. Apparatus as in claim 11 wherein at least one of said first and second clutches is a magnetic clutch.

19. Apparatus for pulling a crystal from a melt according to the Czochralski process, said apparatus comprising an output shaft for pulling said crystal from said melt, an electric motor having a stator and a rotor for developing torque, a hollow shaft fixed to said rotor, said hollow shaft being concentric to said output shaft, a transmission connected to said hollow shaft, a first clutch which is engageable to transmit torque from said rotor to said output shaft via said transmission, and a second clutch which is engageable independently of said first clutch to transmit torque from said rotor to said output shaft independently of said transmission.

20. Apparatus as in claim 19 further comprising a pull shaft to which said crystal is attached, a threaded spindle coaxial to said output shaft, and means connecting said threaded spindle to said pull shaft so that said electric motor can be used to pull said crystal from said melt.

* * * * *